(12) United States Patent
Chou

(10) Patent No.: US 7,760,117 B1
(45) Date of Patent: Jul. 20, 2010

(54) FLIP-FLOP AND PIPELINED ANALOG-TO-DIGITAL CONVERTER UTILIZING THE SAME

(75) Inventor: Yu-Kai Chou, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 28 days.

(21) Appl. No.: 12/354,926

(22) Filed: Jan. 16, 2009

(51) Int. Cl.
*H03M 1/00* (2006.01)

(52) U.S. Cl. .................. 341/136; 327/51; 327/55; 327/57

(58) Field of Classification Search .......... 341/136; 327/51, 55, 57
See application file for complete search history.

(56) References Cited

U.S. PATENT DOCUMENTS

| | | | |
|---|---|---|---|
| 6,147,514 A * | 11/2000 | Shiratake .............. 327/55 |
| 6,396,309 B1 | 5/2002 | Zhao et al. |
| 6,459,317 B1 | 10/2002 | Lu et al. |
| 6,480,037 B1 * | 11/2002 | Song et al. ............ 327/55 |
| 6,703,867 B1 * | 3/2004 | Choe et al. ............ 326/95 |
| 7,439,775 B2 * | 10/2008 | Sohn ..................... 327/55 |

* cited by examiner

*Primary Examiner*—Khai M Nguyen
(74) *Attorney, Agent, or Firm*—Thomas, Kayden, Horstemeyer & Risley

(57) ABSTRACT

A flip-flop includes a sense amplifier stage and a latch stage. The sense amplifier includes a first P type transistor and generates a first sensed signal and a second sensed signal in a first node and a second node, respectively. When the first P type transistor is turned on, the first node is connected to the second node. The latch stage generates a first output signal and a second output signal according to the first and the second sensed signals.

9 Claims, 7 Drawing Sheets

FLIP-FLOP AND PIPELINED ANALOG-TO-DIGITAL CONVERTER UTILIZING THE SAME

BACKGROUND OF THE INVENTION

1. Field of the Invention

The invention relates to a flip-flop, and more particularly to a flip-flop applied in a pipelined analog-to-digital converter (ADC).

2. Description of the Related Art

A flip-flop is capable of providing the functions of a frequency divide-by-2 divider. FIG. 1 is a schematic diagram of a conventional frequency divide-by-2 divider based on a D flip-flop. When the conventional divider receives a clock signal CLK, it can generate an output signal CLK/2 having a half frequency of the clock signal CLK. The clock signal CLK/2 is required to have a precise 50% duty cycle for implementation. Please refer to FIG. 2, which is an internal schematic diagram of the conventional divider, where CLK_ represents an inverse signal of the clock signal CLK. Because the data transmitting path of the conventional divider includes two inverters and two switches and the conventional divider is not a differential circuit, the duty cycle of the output signal CLK/2 will not be 50% and jitter will be introduced into.

BRIEF SUMMARY OF THE INVENTION

Flip-flops are provided. An exemplary embodiment of a flip-flop comprises a sense amplifier stage and a latch stage. The sense amplifier stage comprises a first N type transistor, a second N type transistor, a third N type transistor, a fourth N type transistor, a fifth N type transistor, a sixth N type transistor, a seventh N type transistor, a first P type transistor, a second P type transistor, a third P type transistor, a fourth P type transistor, a fifth P type transistor, a sixth P type transistor, and a seventh P type transistor. The first N type transistor comprises a gate receiving a clock signal and a source receiving a grounding signal. The second N type transistor comprises a gate receiving a first data signal and a source coupled to a drain of the first N type transistor. The third N type transistor comprises a gate receiving a second data signal and a source coupled to the drain of the first N type transistor. The fourth N type transistor comprises a gate receiving the grounding signal, a source receiving the grounding signal, and a drain coupled to a first node. The fifth N type transistor comprises a source coupled to a drain of the second N type transistor and a drain coupled to the first node. The sixth N type transistor comprises a gate receiving a reset signal, a source receiving the grounding signal, and a drain coupled to a second node. The seventh N type transistor comprises a source coupled to a drain of the third N type transistor and a drain coupled to the second node. The first P type transistor comprises a gate receiving the clock signal, a first terminal coupled to a gate of the fifth N type transistor, and a second terminal coupled to a gate of the seventh N type transistor. The second P type transistor comprises a gate receiving the clock signal and a drain coupled to the first node. The third P type transistor comprises a gate coupled to the gate of the fifth N type transistor and the second node, a drain coupled to the first node, and a source coupled to a source of the second P type transistor. The fourth P type transistor comprises a gate receiving the clock signal and a drain coupled to the second node. The fifth P type transistor comprises a gate coupled to the gate of the seventh N type transistor and the first node, a drain coupled to the second node, and a source coupled to a source of the fourth P type transistor. The sixth P type transistor comprises a gate receiving the grounding signal, a drain coupled to the source of the second P type transistor, and a source receiving a power signal. The seventh P type transistor comprises a gate receiving the reset signal, a drain coupled to the source of the fourth P type transistor, and a source receiving the power signal.

The latch stage comprises an eighth N type transistor, a ninth N type transistor, a tenth N type transistor, an eleventh N type transistor, a twelfth N type transistor, a thirteenth N type transistor, an eighth P type transistor, a ninth P type transistor, and a latch unit. The eighth N type transistor comprises a gate receiving a first sensed signal provided by the first node and a source receiving the grounding signal. The ninth N type transistor comprises a gate receiving a second sensed signal provided by the second node and a source receiving the grounding signal. The tenth N type transistor comprises a gate receiving the second data signal and a source coupled to a drain of the eighth N type transistor. The eleventh N type transistor comprises a gate receiving the first data signal and a source coupled to a drain of the ninth N type transistor. The twelfth N type transistor comprises a gate receiving the clock signal, a source coupled to a drain of the tenth N type transistor, and a drain receiving a first output signal provided by a third node. The thirteenth N type transistor comprises a gate receiving the clock signal, a source coupled to a drain of the eleventh N type transistor, and a drain receiving a second output signal provided by a fourth node. The eighth P type transistor comprises a gate receiving the first sensed signal, a source receiving the power signal, and a drain receiving the first output signal. The ninth P type transistor comprises a gate receiving the second sensed signal, a source receiving the power signal, and a drain receiving the second output signal. The latch unit is coupled between the third and the fourth nodes.

Another exemplary embodiment of a flip-flop comprises a first latch unit, a switching transistor, and a second latch unit. The first latch unit receives an input data signal and generates a sensed signal and an inverse of the sensed signal according to a clock signal and the input data signal at a first output node and a second output node of the first latch circuit respectively. The switching transistor comprises a first terminal coupled to the first output node of the first latch unit, a second terminal coupled to the second output node of the first latch unit, and a control terminal receiving the clock signal, for coupling the first output node to the second output node according to the clock signal. The second latch unit generates an output signal and an inverse of the output signal according to the clock signal, the input data signal, the sensed signal and the inverse of the sensed signal.

Pipelined analog to digital converters are also provided. An exemplary embodiment of a pipelined analog to digital converter comprises transformation stages connected in serial, the previous flip flop, and a clock generator. The clock generator generates a first phase signal and a second phase signal according to the first output signal and the second output signal provided by the third node and the fourth node of the flip-flop. Each transformation stage comprises a sub-ADC and a multiplying digital to analog converter (MDAC). The sub-ADC processes an input signal to generate a digital signal according to the first and the second phase signals. The MDAC processes the input signal and the digital signal according to the first and the second phase signals.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In order to overcome the problems of prior arts, a flip-flop having differential circuit architecture is provided. A better performance (e.g. a precise 50% duty cycle output signal) can therefore be achieved when the flip-flop is utilized to form a frequency divider.

Figure 1:
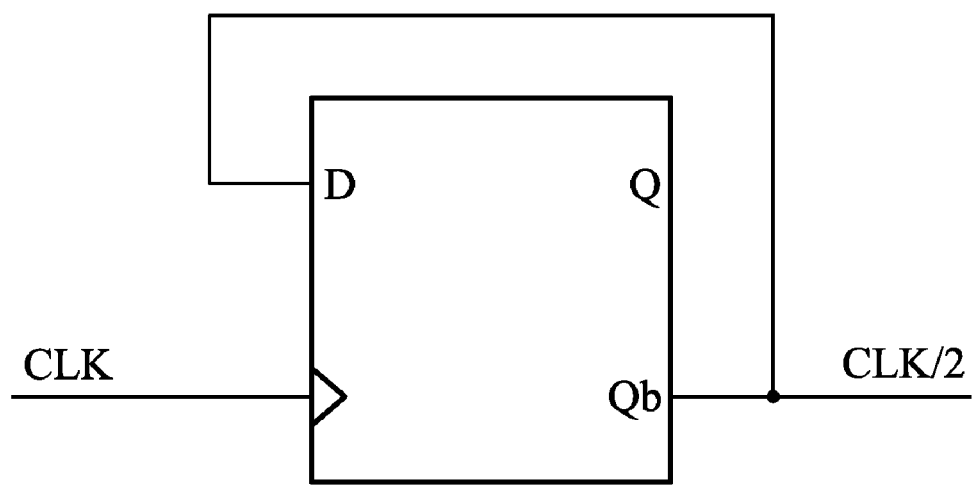
FIG. 1 is a schematic diagram of a conventional frequency divide-by-2 divider based on a flip flop.
Figure 2:
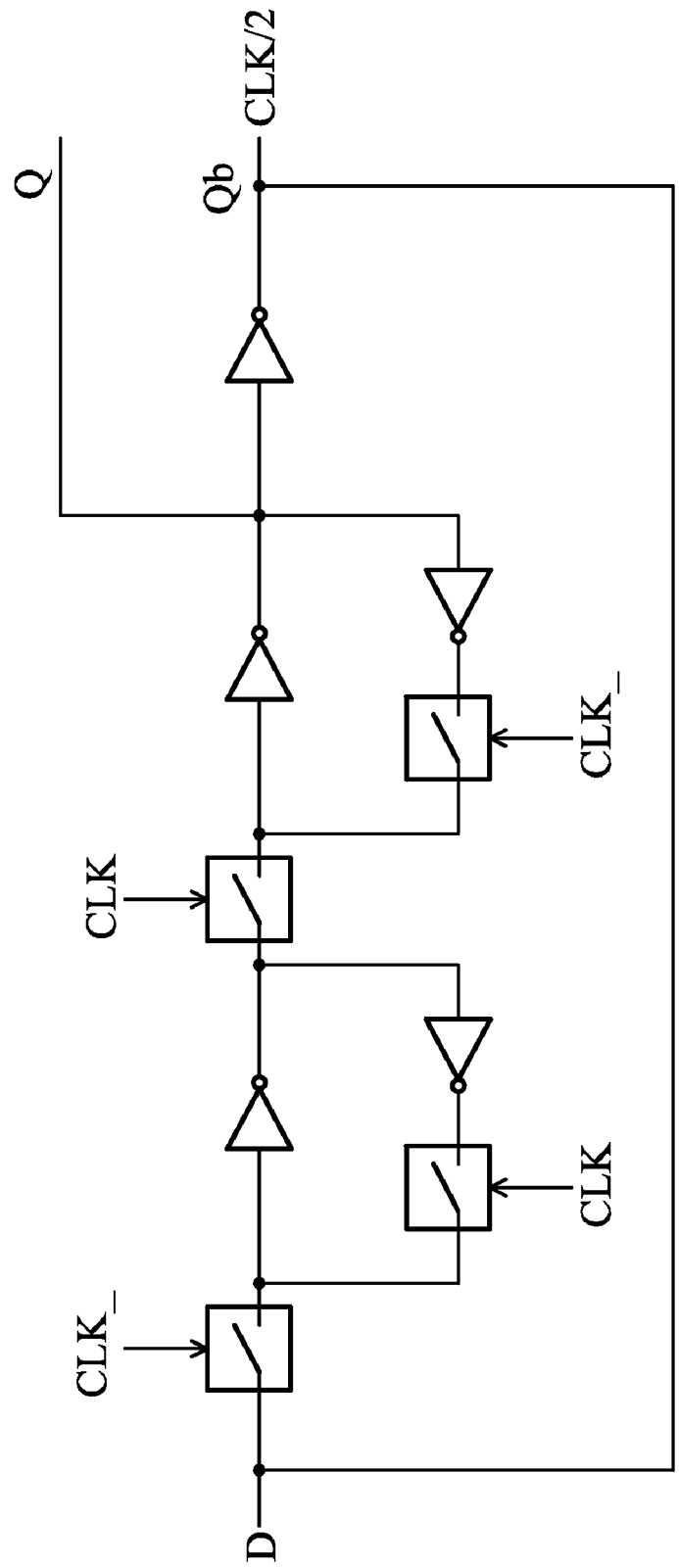
FIG. 2 is an internal schematic diagram of the conventional frequency divide-by-2 divider.
Figure 3:
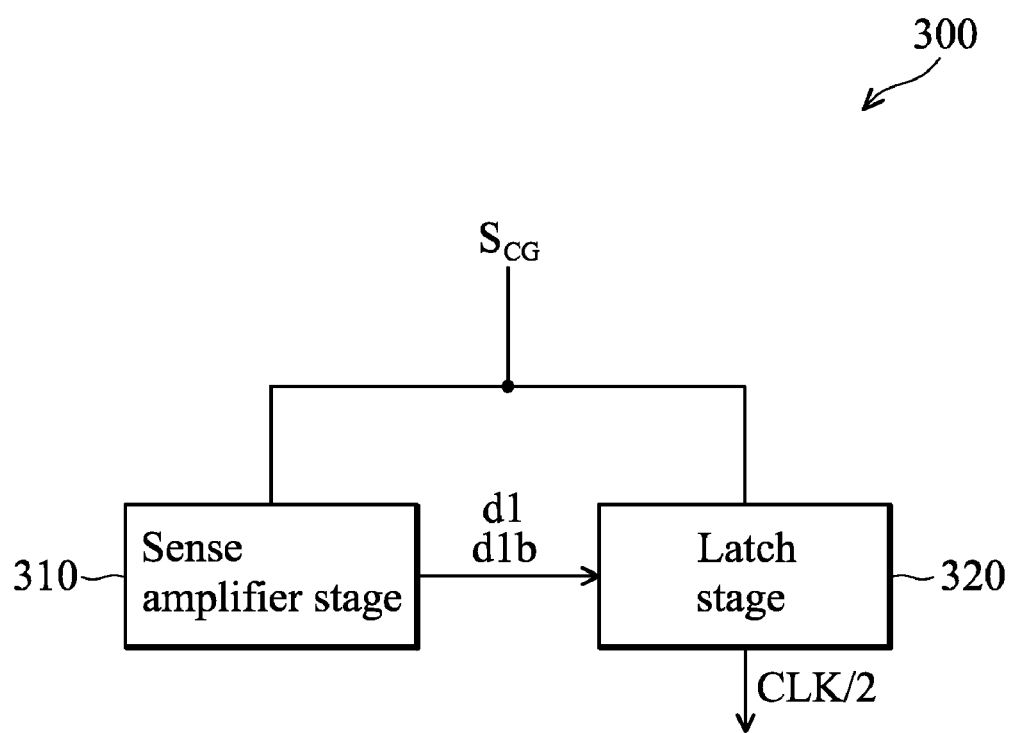
FIG. 3 is a schematic diagram of an exemplary embodiment of a flip flop.

FIG. 3 is a schematic diagram of an exemplary embodiment of a flip-flop. The flip-flop 300 comprises a sense amplifier stage 310 and a latch stage 320. The sense amplifier stage 310 generates a sensed signal d1 and an inverse sensed signal d1b according to a signal group $S_{CG}$ comprising a clock signal CLK. The latch stage 320 is capable of generating a clock signal CLK/2 according to the signal group $S_{CG}$, and sensed signals d1 and d1b. In this embodiment, the clock signal CLK/2 has a half frequency of the clock signal CLK. Additionally the signal group $S_{CG}$ maybe comprises a clock signal CLK, a reset signal RST, data signals d and db, a grounding signal GND, a power signal VDD, or any combinations of above-mentioned signals.

Figure 4A:
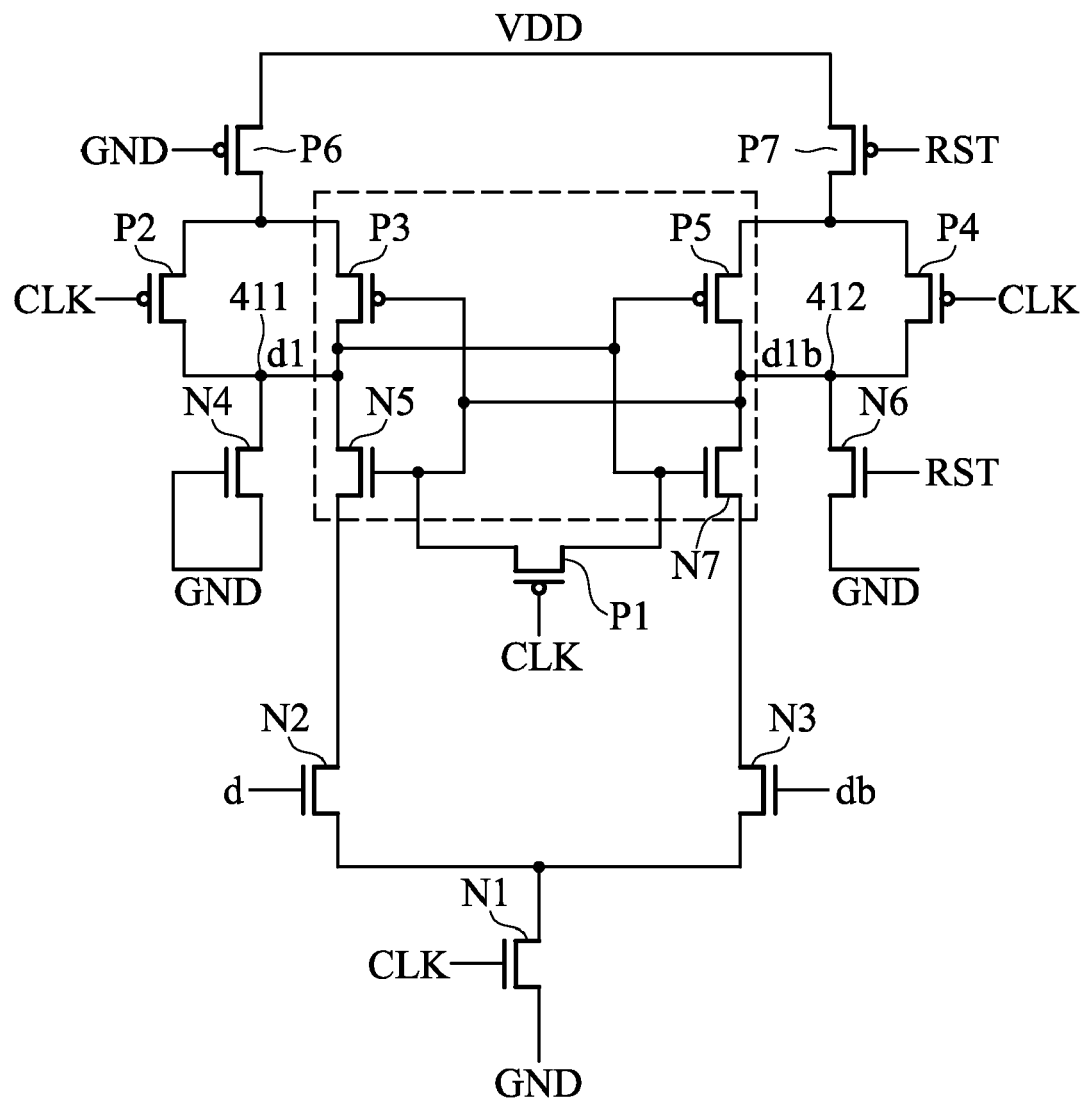
FIG. 4A is a schematic diagram of an exemplary embodiment of the sense amplifier stage.
Figure 4B:
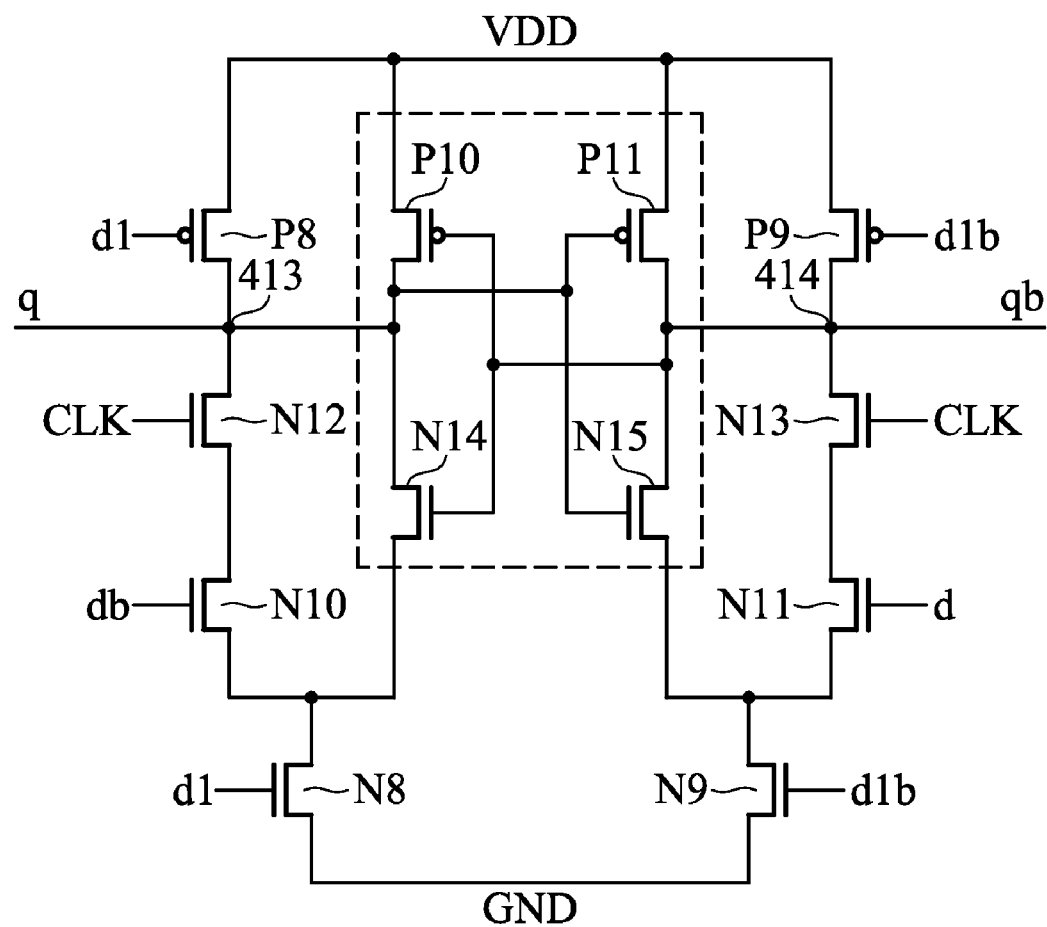
FIG. 4B is a schematic diagram of an exemplary embodiment of the latch stage.

FIG. 4A is a schematic diagram of an exemplary embodiment of the sense amplifier stage. The sense amplifier stage 310 comprises N type transistors N1~N7 and P type transistors P1~P7. The P type transistors P3 and P5 and the N type transistors N5 and N7 constitute a first latch unit. Please note that the types of the transistors shown in FIG. 4A are examples rather than limitations of the present invention. The sense amplifier stage 310 generates sensed signal d1 and inverse sensed signal d1b to nodes 411 and 412, respectively. When the switching transistor P1 is turned on by the clock signal CLK, the node 411 is connected to the node 412. FIG. 4B is a schematic diagram of an exemplary embodiment of the latch stage. The latch stage 320 comprises N type transistors N8~N15 and P type transistors P8~P11, wherein the N type transistors N14 and N15 and P type transistors P10 and P11 constitute a second latch unit. The latch stage 320 respectively generates output signal q and inverse output signal qb to nodes 413 and 414 according to the sensed signal d1 and the inverse sensed signal d1b. Since the connected relationships between transistors N1~N15 and P1~P11 are shown in FIGS. 4A and 4B, the connected relationships are omitted here for brevity. The operating principles of the sense amplifier stage 310 and the latch stage 320 are described in the following.

Referring to FIG. 4A, the sense amplifier stage 310 can be reset according to a reset signal RST of the signal group $S_{CG}$. When the reset signal RST is at a high level, the node 412 is at a low level, turning on the P type switch P3. Since the P type transistors P3 and P6 are turned on, the node 411 is at the high level. In this embodiment, the sensed signal d1 is provided by the node 411 and the inverse sensed signal d1b is provided by the node 412.

When the clock signal CLK is at the high level, the N type transistor N1 is turned on. The first latch unit constituted of two inverters formed by the transistors P3, P5, N5 and N7 senses the data signal d and db, and keeps the values of the data signals d and db at the node 412 and node 411, respectively. In other words, the value of sensed signal d1 is equal to the value of the inverse data signal db, and the value of the inverse sensed signal d1b is equal to the value of the data signal d at this time. When the clock signal CLK transits to the low level, the P type transistor P1 is turned on and therefore the node 411 is coupled to the node 412. This helps the first latch unit save time sensing the data signal d and the inverse data signal db when next pulse of the clock signal CLK arrives.

Referring to FIG. 4B, the latch stage receives the data signal d, inverse data signal db, sensed signal d1 and inverse sensed signal d1b provided by the sense amplifier stage, and generates an output signal q and an inverse output signal qb. For example, when the data signal d is high, the inverse data signal db is low, the sensed signal d1 is low, and the inverse sensed signal d1b is high, the transistors N8, N10 and P9 are turned off, and the transistors P8, N11 and N9 are turned on. The node 413 is connected to the power signal VDD, and the node 414 is connected to the ground, therefore the output signal q is high and the inverse output signal qb is low. The second latch unit constituted of the transistors P10, P11, N14 and N15 can keep the output signal q and the inverse output signal qb when the clock signal CLK is at the low level.

In this embodiment, when the clock signal CLK is at the high level, the level of the output signal q is same as the level of the data signal d. When the clock signal CLK is changed from the high level to the low level, the level of the output signal q is maintained. For example, assuming the data signal d is at the high level when the clock signal is at the high level. When the clock signal CLK is changed from the high level to the low level, the level of the output signal q is at the high level.

Figure 5:
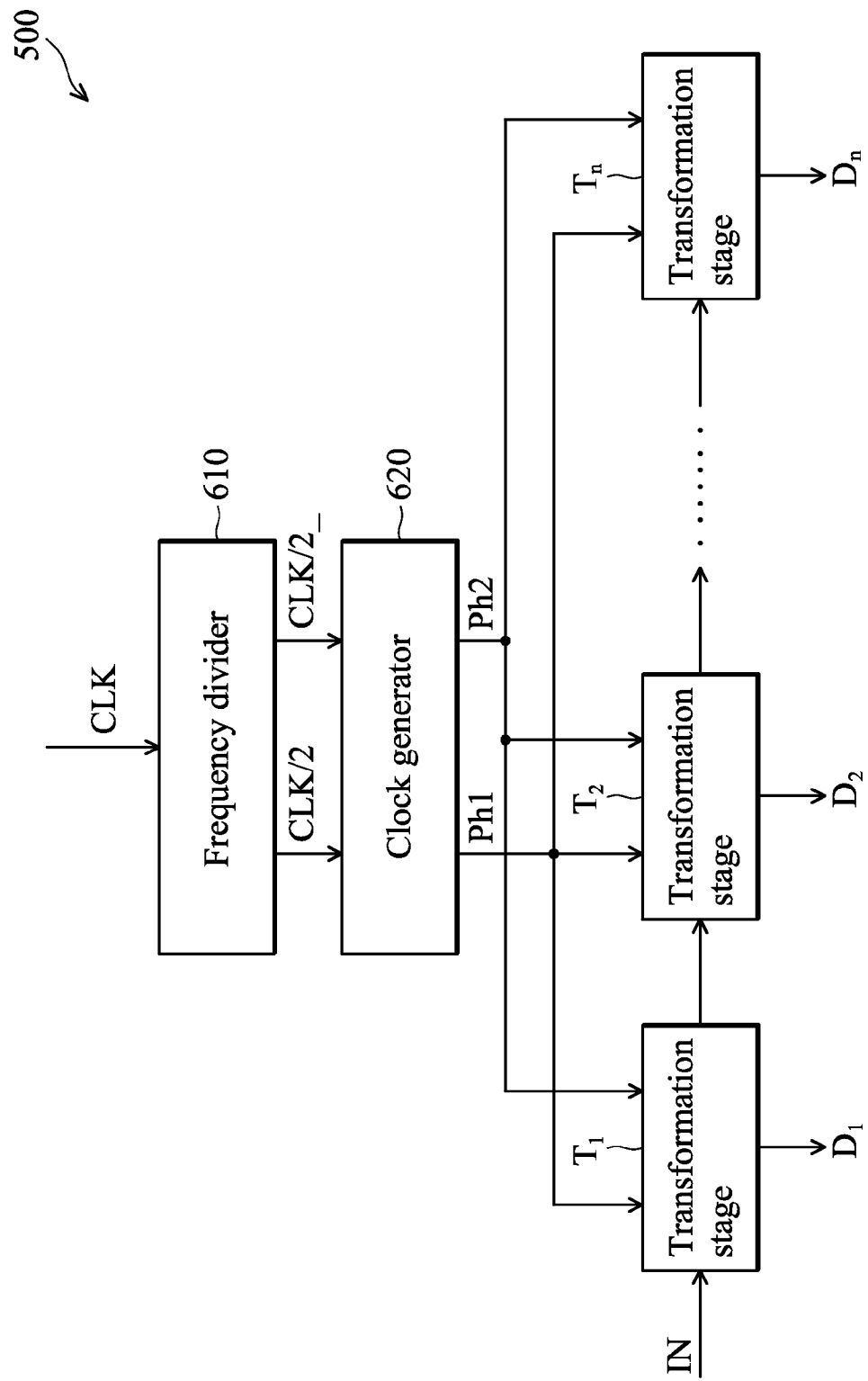
FIG. 5 is a schematic diagram of an exemplary embodiment of a pipelined analog to digital converter.

FIG. 5 is a schematic diagram of an exemplary embodiment of a pipelined analog to digital converter (ADC). The pipelined ADC 500 comprises a frequency divider 610, a clock generator 620, and transforming stages $T_1 \sim T_n$. Transforming stages $T_1 \sim T_n$ transform an input signal IN into digital signals $D_1 \sim D_n$. Since a person having ordinary skill in the art can readily appreciate the operations of transforming stages $T_1 \sim T_n$ after reading the description of transforming stage $T_1$, the following takes the transforming stage $T_1$ as an example.

Figure 6:
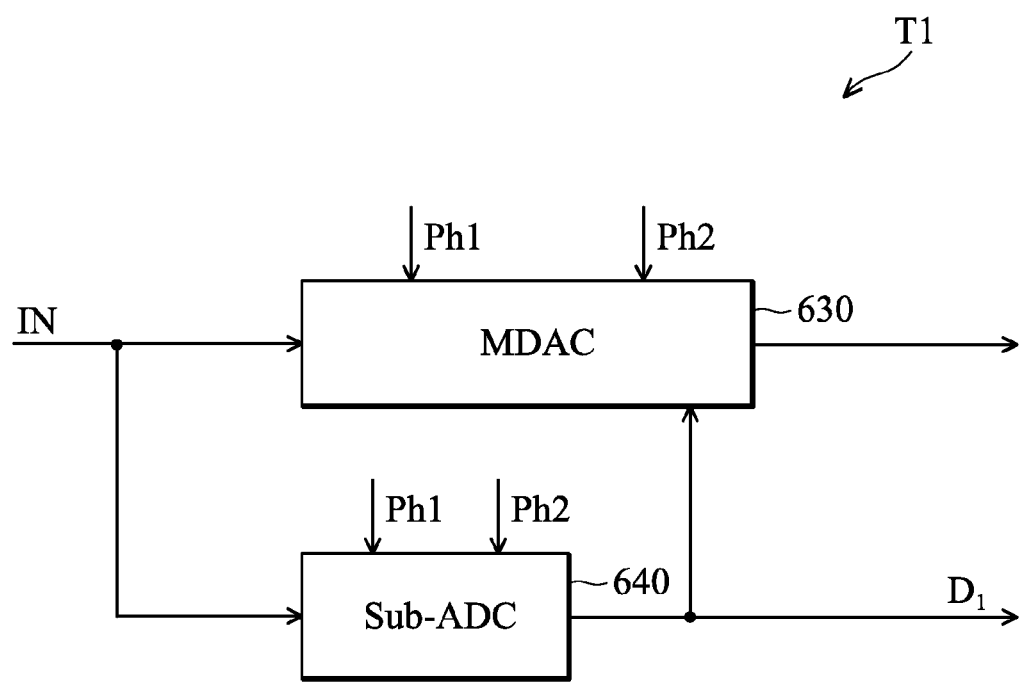
FIG. 6 is a schematic diagram of an exemplary embodiment of the transforming stage.

FIG. 6 is a schematic diagram of an exemplary embodiment of the transforming stage $T_1$. The transforming stage $T_1$ comprises a multiplying digital to analog converter (MDAC) 630 and a sub-ADC 640. Please refer to FIG. 6 in conjunction with FIG. 5. The frequency divider 610 generates the clock signal CLK/2 and its inverse CLK/2_ according to the clock signal CLK. Because the flip-flop 300 has a differential circuit structure, each of the clock signal CLK/2 and the inverse clock signal CLK/2 has a precise 50% duty cycle. The difference between the falling edges of the clock signals CLK/2 and CLK/2_ is T/2, wherein T is a period of the clock signal CLK/2.

In this embodiment, the frequency divider 610 is constituted by the flip-flop 300. The flip-flop 300 is capable of providing the functions of the frequency divider 610 when the connected relationship of the flip-flop 300 is controlled. In one embodiment, when the gates of the N type transistors N2 and N11 receive the inverse output signal qb, the inverse output signal qb serves as the clock signal CLK/2_.

The clock generator 620 generates phase signals Ph1 and Ph2 according to the clock signals CLK/2 and CLK/2_. The sub-ADC 640 processes the input signal IN to generate the digital signal $D_1$ according to phase signals Ph1 and Ph2. The MDAC processes the input signal IN and the digital signal $D_1$ according to the phase signals Ph1 and Ph2. Since the clock signals CLK/2 and CLK/2 are both 50% duty cycle clocks, the sampling edge of each transforming stage T1~Tn can be well-determined, and thereby the performance of the pipelined ADC 500 can be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flip flop, comprising:
    a sense amplifier stage comprising:
        a first N type transistor comprising a gate receiving a clock signal and a source receiving a grounding signal;
        a second N type transistor comprising a gate receiving a first data signal and a source coupled to a drain of the first N type transistor;
        a third N type transistor comprising a gate receiving a second data signal and a source coupled to the drain of the first N type transistor;
        a fourth N type transistor comprising a gate receiving the grounding signal, a source receiving the grounding signal, and a drain coupled to a first node;
        a fifth N type transistor comprising a source coupled to a drain of the second N type transistor and a drain coupled to the first node;
        a sixth N type transistor comprising a gate receiving a reset signal, a source receiving the grounding signal, and a drain coupled to a second node;
        a seventh N type transistor comprising a source coupled to a drain of the third N type transistor and a drain coupled to the second node;
        a first P type transistor comprising a gate receiving the clock signal, a first terminal coupled to a gate of the fifth N type transistor, and a second terminal coupled to a gate of the seventh N type transistor;
        a second P type transistor comprising a gate receiving the clock signal and a drain coupled to the first node;
        a third P type transistor comprising a gate coupled to the gate of the fifth N type transistor and the second node, a drain coupled to the first node, and a source coupled to a source of the second P type transistor;
        a fourth P type transistor comprising a gate receiving the clock signal and a drain coupled to the second node;
        a fifth P type transistor comprising a gate coupled to the gate of the seventh N type transistor and the first node, a drain coupled to the second node, and a source coupled to a source of the fourth P type transistor;
        a sixth P type transistor comprising a gate receiving the grounding signal, a drain coupled to the source of the second P type transistor, and a source receiving a power signal; and
        a seventh P type transistor comprising a gate receiving the reset signal, a drain coupled to the source of the fourth P type transistor, and a source receiving the power signal; and
    a latch stage comprising:
        an eighth N type transistor comprising a gate coupled to the first node and a source receiving the grounding signal;
        a ninth N type transistor comprising a gate coupled to the second node and a source receiving the grounding signal;
        a tenth N type transistor comprising a gate receiving the second data signal and a source coupled to a drain of the eighth N type transistor;
        an eleventh N type transistor comprising a gate receiving the first data signal and a source coupled to a drain of the ninth N type transistor;
        a twelfth N type transistor comprising a gate receiving the clock signal, a source coupled to a drain of the tenth N type transistor, and a drain coupled to a third node;
        a thirteenth N type transistor comprising a gate receiving the clock signal, a source coupled to a drain of the eleventh N type transistor, and a drain coupled to a fourth node;
        an eighth P type transistor comprising a gate coupled to the first node, a source receiving the power signal, and a drain coupled to the third node;
        a ninth P type transistor comprising a gate coupled to the second node, a source receiving the power signal, and a drain coupled to the fourth node; and
        a latch unit coupled between the third and the fourth nodes.

2. The flip flop as claimed in claim 1, wherein the first and the second data signals are inverse, a first sensed signal provided by the first node and a second sensed signal provided by the second node are inverse, and a first output signal provided by the third node and a second output signal provided by the fourth node are inverse.

3. The flip flop as claimed in claim 1, wherein the latch unit comprises:
    a fourteenth N type transistor comprising a gate coupled to the fourth node, a source coupled to the source of the tenth N type transistor, and a drain coupled to the third node;
    a tenth P type transistor comprising a gate coupled to the gate of the fourteenth N type transistor, a source receiving the power signal, and a drain coupled to the drain of the fourteenth N type transistor;
    a fifteenth N type transistor comprising a gate coupled to the third node, a source coupled to the source of the ninth N type transistor, and a drain coupled to the fourth node; and
    a eleventh P type transistor comprising a gate coupled to the gate of the fifteenth N type transistor, a source receiving the power signal, and a drain coupled to the drain of the fifteenth N type transistor.

4. A pipelined analog to digital converter comprising:
    a flip flop as claimed in claim 1;
    a clock generator for generating a first phase signal and a second phase signal according to a first output signal and a second output signal provided by the third node and the fourth node of the flip-flop; and a plurality of transformation stages connected in serial, each comprising:

a sub-ADC processing an input signal to generate a digital signal according to the first and the second phase signals; and a multiplying digital to analog converter processing the input signal and the digital signal according to the first and the second phase signals.

5. The pipelined ADC as claimed in claim 4, wherein the fourth node is coupled to the gate of the second N type transistor.

6. The pipelined ADC as claimed in claim 5, wherein the first and the second data signals are inverse, a first sensed signal provided by the first node and a second sensed signal provided by the second node are inverse, and a first output signal provided by the third node and a second output signal provided by the fourth node are inverse.

7. The pipelined ADC as claimed in claim 4, wherein the latch unit comprises:

a fourteenth N type transistor comprising a gate coupled to the fourth node, a source coupled to the source of the tenth N type transistor, and a drain coupled to the third node;

a tenth P type transistor comprising a gate coupled to the gate of the fourteenth N type transistor, a source receiving the power signal, and a drain coupled to the drain of the fourteenth N type transistor;

a fifteenth N type transistor comprising a gate coupled to the third node, a source coupled to the source of the ninth N type transistor, and a drain coupled to the fourth node; and a eleventh P type transistor comprising a gate coupled to the gate of the fifteenth N type transistor, a source receiving the power signal, and a drain coupled to the drain of the fifteenth N type transistor.

8. A flip-flop, comprising:

a first latch unit, for receiving an input data signal and generating a sensed signal and an inverse of the sensed signal according to a clock signal and the input data signal at a first output node and a second output node of the first latch circuit respectively;

a switching transistor, comprising a first terminal coupled to the first output node of the first latch unit, a second terminal coupled to the second output node of the first latch unit, and a control terminal receives the clock signal, for coupling the first output node to the second output node according to the clock signal; and a second latch unit, for generating an output signal and an inverse of the output signal according to the clock signal, the input data signal, the sensed signal and the inverse of the sensed signal.

9. The flip-flop as claimed in claim 8, wherein the first latch unit comprises:

a first N type transistor comprising a gate coupled to the second output node, and a drain coupled to the first output node;

a first P type transistor comprising a gate coupled to the gate of the first N type transistor, and a drain coupled to the drain of the first N type transistor;

a second N type transistor comprising a gate coupled to the first output node, and a drain coupled to the second output node; and a second P type transistor comprising a gate coupled to the gate of the second N type transistor, and a drain coupled to the drain of the second N type transistor, and wherein the first terminal of the switching transistor is directly connected to the first output node, the second terminal of the switching transistor is directly connected to the second output node, and the first output node is coupled to the second output node when the switching transistor is turned on by the clock signal.

* * * * *